(12) United States Patent
Agarwal et al.

(10) Patent No.: US 10,312,221 B1
(45) Date of Patent: Jun. 4, 2019

(54) STACKED DIES AND DUMMY COMPONENTS FOR IMPROVED THERMAL PERFORMANCE

(71) Applicants: Rahul Agarwal, Livermore, CA (US); Kaushik Mysore Srinivasa Setty, Austin, TX (US); Milind S. Bhagavat, Los Altos, CA (US); Brett P. Wilkerson, Austin, TX (US)

(72) Inventors: Rahul Agarwal, Livermore, CA (US); Kaushik Mysore Srinivasa Setty, Austin, TX (US); Milind S. Bhagavat, Los Altos, CA (US); Brett P. Wilkerson, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/844,575

(22) Filed: Dec. 17, 2017

(51) Int. Cl.
| H01L 23/52 | (2006.01) |
| H01L 25/065 | (2006.01) |
| H01L 23/538 | (2006.01) |
| H01L 23/498 | (2006.01) |
| H01L 23/00 | (2006.01) |

(52) U.S. Cl.
CPC .... *H01L 25/0657* (2013.01); *H01L 23/49811* (2013.01); *H01L 23/5384* (2013.01); *H01L 24/10* (2013.01)

(58) Field of Classification Search
CPC . H01L 25/0657; H01L 23/5384; H01L 24/10; H01L 24/11; H01L 23/49811
USPC ...................................................... 257/774
See application file for complete search history.

(56) References Cited

U.S. PATENT DOCUMENTS

| 3,761,310 | A | 9/1973 | Preobrazhentsev et al. |
| 6,219,243 | B1 | 4/2001 | Ma et al. |
| 8,779,599 | B2 * | 7/2014 | Lin ..................... H01L 25/0652 257/685 |
| 9,224,697 | B1 * | 12/2015 | Kwon ................... H01L 23/562 |

(Continued)

OTHER PUBLICATIONS

U.S. Appl. No. 15/686,558, filed Aug. 25, 2017, Wuu et al.

(Continued)

*Primary Examiner* — Luan C Thai
(74) *Attorney, Agent, or Firm* — Timothy M. Honeycutt (57) ABSTRACT

Various semiconductor chip devices with stacked chips are disclosed. In one aspect, a semiconductor chip device includes a stack of plural semiconductor chips. Each two adjacent semiconductor chips of the plural semiconductor chips is electrically connected by plural interconnects and physically connected by a first insulating bonding layer. A first stack of dummy chips is positioned opposite a first side of the stack of semiconductor chips and separated from the plural semiconductor chips by a first gap. Each two adjacent of the first dummy chips are physically connected by a second insulating bonding layer. A second stack of dummy chips is positioned opposite a second side of the stack of semiconductor chips and separated from the plural semiconductor chips by a second gap. Each two adjacent of the second dummy chips are physically connected by a third insulating bonding layer. The first, second and third insulating bonding layers include a first insulating layer and a second insulating layer bonded to the first insulating layer. An insulating layer is in the first gap and another insulating layer is in the second gap.

22 Claims, 9 Drawing Sheets

(56) References Cited

U.S. PATENT DOCUMENTS

| | | | |
|---|---|---|---|
| 9,258,890 B2* | 2/2016 | Seguido | H05K 1/0296 |
| 9,613,931 B2* | 4/2017 | Lin | H01L 25/0652 |
| 2009/0243086 A1 | 10/2009 | Warren | |
| 2012/0043669 A1 | 2/2012 | Refai-Ahmed et al. | |
| 2014/0312491 A1 | 10/2014 | Jin et al. | |
| 2015/0311182 A1 | 10/2015 | Lee et al. | |
| 2016/0070318 A1 | 3/2016 | Wu et al. | |
| 2018/0012857 A1 | 1/2018 | Lin | |
| 2018/0138101 A1* | 5/2018 | Yu | H01L 21/563 |
| 2019/0006263 A1 | 1/2019 | Yu et al. | |

OTHER PUBLICATIONS

Sandeep Kumar Samal et al.; *Adaptive Regression-Based Thermal Modeling and Optimization for Monolithic 3-D ICs*; IEEE Transactions on Computer-Aided Design of Integrated Circuits and Systems; vol. 35; No. 10; Oct. 2016; pp. 1707-1720.

USPTO Office Action notification date Jan. 28, 2019; U.S. Appl. No. 15/686,558.

* cited by examiner

STACKED DIES AND DUMMY COMPONENTS FOR IMPROVED THERMAL PERFORMANCE

BACKGROUND OF THE INVENTION

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

Stacked dice arrangements involve placing or stacking one or more semiconductor chips on a base semiconductor chip. In some conventional variants, the base semiconductor chip is a high heat dissipating device, such as a microprocessor. The stacked chips are sometimes memory devices. In a typical conventional microprocessor design, the chip itself has a floor plan with various types of logic blocks, such as floating point, integer, I/O management, and cache blocks frequently interspersed among each other. The power densities of the blocks vary: some have relatively higher power densities and some have relatively lower power densities.

BRIEF DESCRIPTION OF THE DRAWINGS

The foregoing and other advantages of the invention will become apparent upon reading the following detailed description and upon reference to the drawings in which.

DETAILED DESCRIPTION

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing.

A process flow to transform a bare semiconductor wafer into a collection of chips and then mount those chips on packages or other boards involves a large number of individual steps. Because the processing and mounting of a semiconductor chip proceeds in a generally linear fashion, that is, various steps are usually performed in a specific order, it is desirable to be able to identify defective parts as early in a flow as possible. In this way, defective parts may be identified so that they do not undergo needless additional processing. This economic incentive to identify defective parts as early in the processing phase as possible is certainly present in the design and manufacture of stacked semiconductor chip devices.

Thermal management of semiconductor chips in a stacked arrangement remains a technical challenge during required electrical testing and operation of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

One possible solution for thermal dissipation with stacks including high powered processors involves placing the processor as the top die in a stack of dies (i.e. closest to heat sink), although such techniques introduce a new power delivery challenge. Power, ground and signals will require routing up through the underlying lower power dies. This requires dense microbumps and through-chip-vias through the stacked dies, which represents significant area overheads for the stacked dies.

In accordance with one aspect of the present invention, a semiconductor chip device is provided that includes a first semiconductor chip, a second semiconductor chip stacked on the first semiconductor chip, and a first insulating bonding layer positioned between the first semiconductor chip and the second semiconductor chip and bonds the first semiconductor chip to the second semiconductor chip. The first insulating bonding layer includes a first insulating layer and a second insulating layer bonded to the first insulating layer. There are plural interconnects between and electrically connecting the first semiconductor chip and the second semiconductor chip. A first dummy component is stacked on the first semiconductor chip and separated from the second semiconductor chip by a first gap. A second insulating bonding layer is positioned between the first dummy component and the first semiconductor chip and bonds the first dummy component to the first semiconductor chip. The second insulating bonding layer includes a first insulating layer and a second insulating layer bonded to the first insulating layer. A second dummy component is stacked on the first semiconductor chip and separated from the second semiconductor chip by a second gap. A third insulating bonding layer is positioned between the second dummy component and the first semiconductor chip and bonds the second dummy component to the first semiconductor chip. The third insulating bonding layer includes a first insulating layer and a second insulating layer bonded to the first insulating layer. An insulating layer is in the first gap and another insulating layer is in the second gap.

In accordance with another aspect of the present invention, a semiconductor chip device is provided that includes a stack of plural semiconductor chips. Each two adjacent semiconductor chips of the plural semiconductor chips is electrically connected by plural interconnects and physically connected by a first insulating bonding layer. The first insulating bonding layer includes a first insulating layer and a second insulating layer bonded to the first insulating layer. A first stack of dummy chips is positioned opposite a first side of the stack of semiconductor chips and separated from the plural semiconductor chips by a first gap. Each two adjacent of the first dummy chips is physically connected by a second insulating bonding layer. The second insulating bonding layer includes a first insulating layer and a second insulating layer bonded to the first insulating layer. A second stack of dummy chips is positioned opposite a second side of the stack of semiconductor chips and separated from the plural semiconductor chips by a second gap. Each two adjacent of the second dummy chips is physically connected by a third insulating bonding layer. The third insulating bonding layer includes a first insulating layer and a second insulating layer bonded to the first insulating layer. An insulating layer is in the first gap and another insulating layer is in the second gap.

In accordance with another aspect of the present invention, a method of manufacturing is provided that includes stacking a second semiconductor chip on a first semiconductor chip, and forming a first insulating bonding layer between the first semiconductor chip and the second semiconductor chip that bonds the first semiconductor chip to the second semiconductor chip. The first insulating bonding layer includes a first insulating layer and a second insulating layer bonded to the first insulating layer. Plural interconnects are formed between and electrically connect the first semiconductor chip and the second semiconductor chip. A first dummy component is stacked on the first semiconductor chip and separated from the second semiconductor chip by a first gap. A second insulating bonding layer is formed between the first dummy component and the first semiconductor chip and bonds the first dummy component to the first semiconductor chip. The second insulating bonding layer includes a first insulating layer and a second insulating layer bonded to the first insulating layer. A second dummy component is stacked on the first semiconductor chip and separated from the second semiconductor chip by a second gap. A third insulating bonding layer is formed between the second dummy component and the first semiconductor chip and bonds the first dummy component to the first semiconductor chip. The third insulating bonding layer includes a first insulating layer and a second insulating layer bonded to the first insulating layer. An insulating layer is formed in the first gap and another insulating layer is formed in the second gap.

Figure 1:
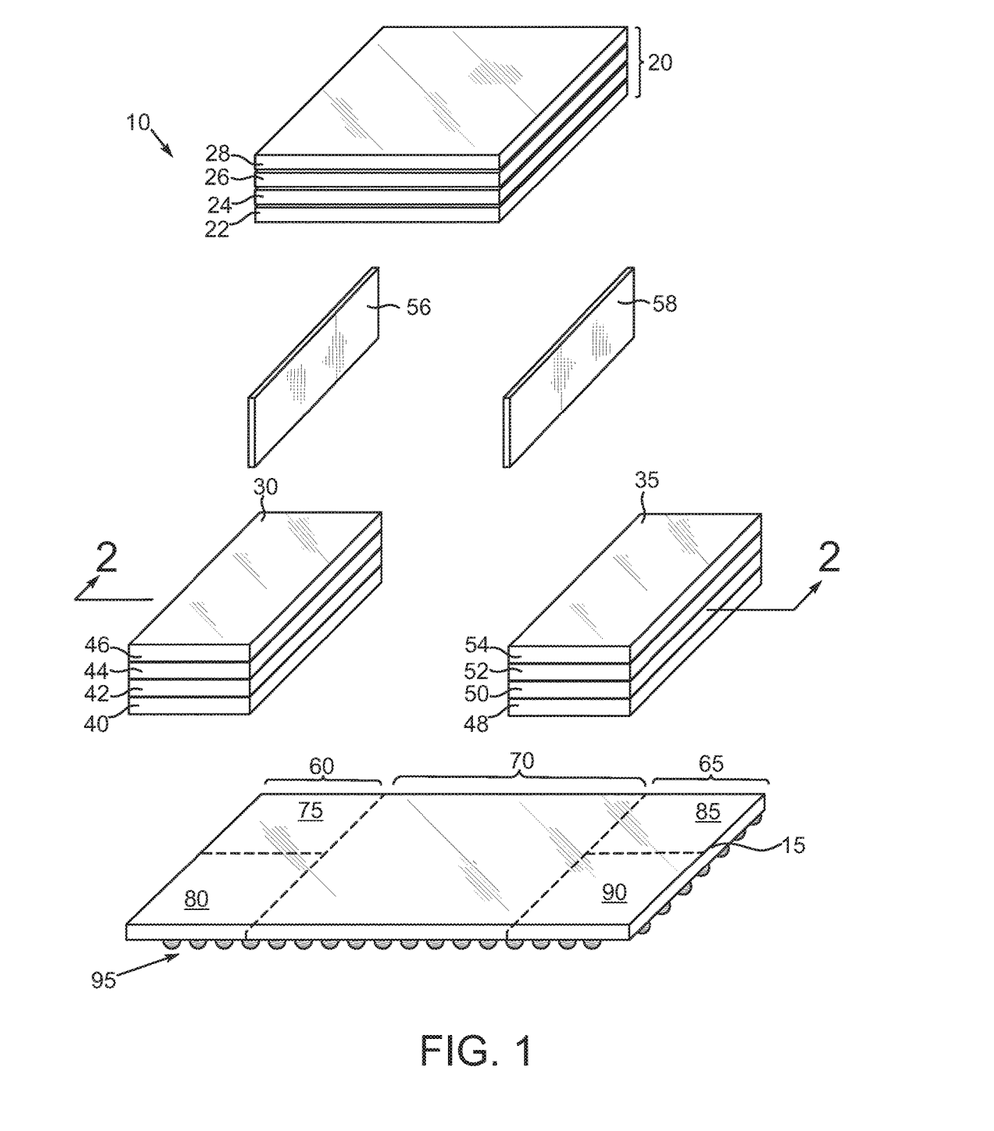
FIG. 1 is an exploded pictorial view of an exemplary semiconductor chip device that includes a semiconductor chip and a stack of semiconductor chips and dummy components positioned thereon.

In the drawings described below, reference numerals are generally repeated where identical elements appear in more than one figure. Turning now to the drawings, and in particular to FIG. 1, therein is depicted a partially exploded pictorial view of an exemplary semiconductor chip device 10 that includes a semiconductor chip 15, a stack 20 of semiconductor chips 22, 24, 26 and 28 that are stacked on the semiconductor chip 15 and one or more dummy components 30 and 35 that are mounted at select locations on the semiconductor chip 15 for thermal management purposes. The chip stack 20 can number one or more chips 22, 24 etc. The dummy components 30 and 35 can be monolithic or configured as stacks of dummy chips. Thus the dummy component 30 can include stacked dummy chips 40, 42, 44 and 46 and the dummy components can include stacked dummy chips 48, 50, 52 and 54. The dummy components 30 and 35 can number one or more chips 40, 42, 48, 50 etc. The chip stack 20 is bracketed by two insulating layers 56 and 58 that are positioned in respective narrow gaps between the chip stack 20 and the dummy components 30 and 35.

The semiconductor chip 15 has a floor plan that includes two high heat producing areas 60 and 65 positioned to either side of a centrally located low heat producing area 70. As used herein, the terms "high" and "low" signify that the low high heat producing area 70 generates less heat than either or the combination of the high heat producing portions 60 and 65. The high heat producing area 60 can be a processor core containing portion that contains, for example, processor cores 75 and 80. A processor core is an execution portion of the semiconductor chip 15. The high heat producing area 65 can similarly be a processor core containing portion that contains, for example, processor cores 85 and 90. It should also be understood that greater than four logic cores, such as the cores 75, 80, 85 and 90 depicted, can be implemented in the semiconductor chip 15. Of course, other arrangements can be logic other than processor cores. The low heat producing area 70 can include bus logic, I/O logic, cache logic or the like. A technical goal of establishing the depicted footprint or floor plan for the semiconductor chip 15 is to, at the layout design phase, position the low heat producing area 70 in a separate location from the high heat producing areas 60 and 65 so that the chip stack 20 can be mounted where there is relatively lesser heat dissipation. To interface electrically with another component such as a circuit board or other device, the semiconductor chip 15 can include plural I/O structures 95. The I/O structures 95 can be solder balls, solder bumps, conductive pillars, or other types of interconnect structures. Well-known lead free solders, such as Sn—Ag, Sn—Ag—Cu or others can be used. Conductive pillars of copper, gold, aluminum, combinations of the these or the like can be used with or without solder caps.

Figure 2:
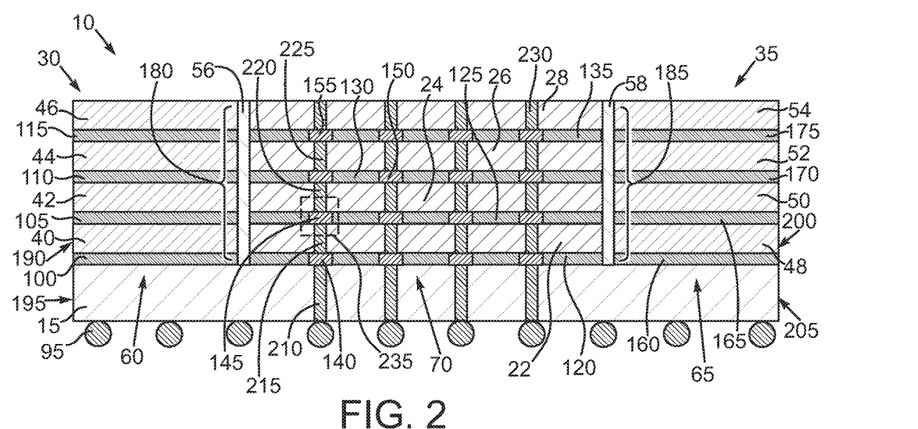
FIG. 2 is a sectional view of FIG. 1 taken at section 2-2.

Additional details of the semiconductor chip device 10 can be understood by referring now also to FIG. 2, which is a sectional view of FIG. 1 taken at section 2-2. As noted above, the dummy components 30 and 35 are preferably positioned on the high heat producing areas 60 and 65 of the semiconductor chip 15 while the chip stack 20 is preferably mounted on the low heat producing area 70 of the semiconductor chip 15. The dummy components 30 and 35 provide a conductive heat transfer pathway upward from the high heat producing areas 60 and 65. In this way, a heat spreader of one sort or another can be eventually positioned on the dummy components 30 and 35 and also placed in thermal contact with the top most semiconductor chip 22 to convey heat away from the high heat producing areas 60 and 65 and even the low heat producing area 70. The dummy components 30 and 35 can be composed of silicon, copper, graphite, sapphire, diamond or other thermally conducting materials. Silicon is relatively inexpensive. The lowermost dummy chip 40 of the dummy component 30 is thermally and mechanically connected to the semiconductor chip by way of an insulating bonding layer 100. The insulating bonding layer 100 consists of two or more insulating layers bonded together by annealing. In this exemplary arrangement, the insulating bonding layer 100 consists of a laminate of a silicon oxynitride layer and a silicon oxide (SiOx) layer, which can be stoichiometric or non-stoichiometric. The insulating bonding layer 100 joins the lowermost dummy chip 40 to the semiconductor chip 15. Similar insulating bonding layers 105, 110 and 115 are interposed between the dummy chip 40, and the dummy chip 42, between the dummy chip 44 and the dummy chip 42 and between the dummy chip 46 and the dummy chip 44. As described in more detail below, the insulating bonding layers 100, 105, 110 and 115 are fabricated by joining together two or more insulating layers, such as a silicon oxynitride layer and a silicon oxide (SiOx) layer followed by an anneal process. The chips 22, 24, 26 and 28 of the chip stack 20 are similarly connected to the semiconductor chip 15 by way of an insulating bonding layer 120 and plural interspersed insulating bonding layers 125, 130 and 135. In addition, plural interconnects 140 are interspersed in the insulating bonding layer 120, plural interconnects 145 are interspersed in the insulating bonding layer 125, plural interconnects 150 are interspersed in the insulating bonding layer 130 and plural interconnects 155 are interspersed in the insulating bonding layer 135. Additional details of one of the plural interconnects 145 will be described in conjunction with a subsequent figure and will be illustrative of the other interconnects 140, 145, 150 and 155. The lowermost dummy chip 48 of the dummy component 35 is similarly bonded to the semiconductor chip 15 by way of an insulating bonding layer 160 and the other dummy chips 50, 52 and 54 are similarly laminated or sandwiched with additional insulating bonding layers 165, 170 and 175, which can be like the insulating bonding layers 100, 105, 110 and 115 just described.

As noted above, the insulating layers 56 and 58 are positioned in the gaps 180 and 185 respectively between the chip stack 20 and the dummy components 30 and 35. The dummy components 30 and 35 are advantageously positioned quite close to the chip stack 20 so that the gaps 180 and 285 are quite small and, depending upon overall device geometry, in the neighborhood of 20 to 40 microns in width. Note also that the dummy components 30 and 35 are not only sized but also positioned so that a left edge 190 of at least the lower most dummy chip 40 is coterminous or very close to coterminous with a left edge 195 of the semiconductor chip 15. The dummy component 35 is similarly constructed and positioned so that a right edge 200 of the lower most dummy chip 48 is coterminous with a right edge 205 of the semiconductor chip 15. This selection of geometry and positioning is designed to increase the available surface area for heat transfer between a semiconductor chip 15 and the dummy components 30 and 35.

Figure 3:
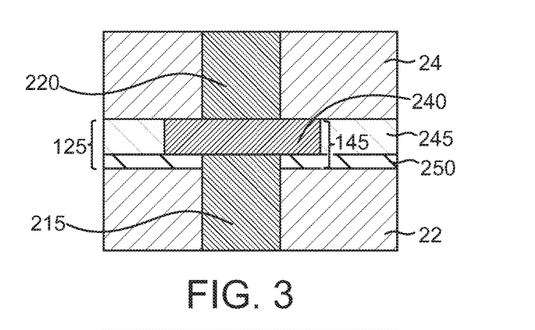
FIG. 3 is a portion of FIG. 2 shown at greater magnification.
Figure 4:
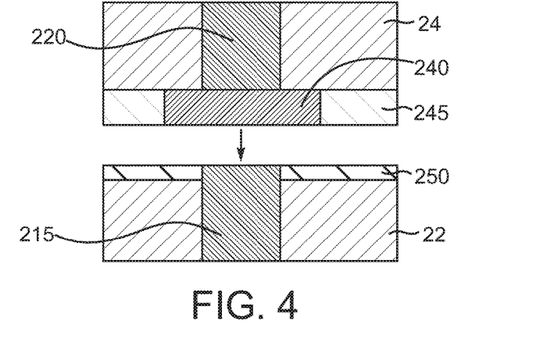
FIG. 4 is a sectional view like FIG. 3, but depicting exemplary stacking.

The semiconductor chip 15 includes plural through-chip-vias 210, the semiconductor chip 22 includes plural through-chip-vias 215, the semiconductor chip 24 includes plural through-chip-vias 220, the semiconductor chip 26 includes plural through-chip-vias 225 and the semiconductor chip 28 includes plural through-chip-vias 230. The through-chip-vias 210, 215, 220, 225 and 230 can be composed of a variety of different conductor materials such as copper, gold, aluminum, platinum, palladium, combinations of these or the like and will typically include an insulating liner layer of silicon dioxide or other insulating material to provide isolation from the surrounding semiconductor materials. Note the location of the dashed rectangle 235, which circumscribes one of the interconnects 145 and portions of the semiconductor chips 20, 22 and 24. That portion circumscribed by the dashed rectangle 235 is shown at greater magnification in FIG. 3 and attention is now turned thereto. Note that in FIG. 3, a portion of one of the through-chip-vias 215 and 220 are depicted as well as the insulating bonding layer 125. The interconnect 145 consists of a bond pad 240 that is interspersed in a silicon oxide (SiOx) layer 245 of the semiconductor chip 24 and is metallurgically joined to the through-chip-via 220. The through-chip-via 215 of the semiconductor chip 22 projects up through a silicon oxynitride layer 250. The bond pad 240 and the through-chip-via 215 are metallurgically bonded by way of an anneal process. Thus and as shown in FIG. 3 and FIG. 4, the semiconductor chip 24 is brought down or otherwise positioned on the semiconductor chip 22 so that the silicon oxynitride layer 250 is on or in very close proximity to the silicon dioxide layer 245 and the bond pad 240 is on or in very close proximity to the through-chip-via 215. Thereafter, an anneal process is performed which produces a transitory thermal expansion of the bond pad 240 and the through-chip-via 215 bringing those structures into physical contact and causing them to form a metallurgical bond that persists even after the chips 22 and 24 are cooled and the bond pad 240, the through-chip-via 215 and the through-chip-via 220 contract thermally. There is also formed an oxide/oxynitride bond between the SiOx layer 245 and the silicon oxynitride layer 250. This same type of bonding process is used for the remainder of the semiconductor chips 24, 26 and 28 and also for the insulating bonding layers 100, 105, 110 and 115 and 160, 165, 170 and 175 albeit for those layers there will not be the attendant metal layers and metallurgical bonding.

Figure 5:
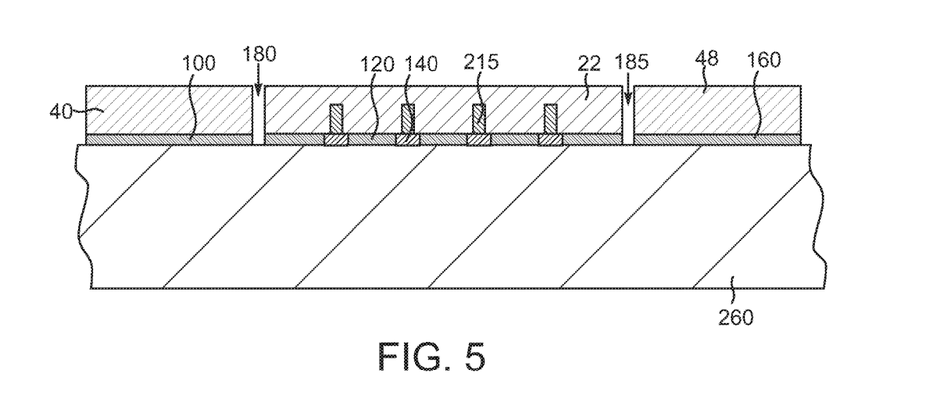
FIG. 5 is a sectional view of an exemplary reconstituted wafer of semiconductor chips and dummy chips following initial processing.
Figure 6:
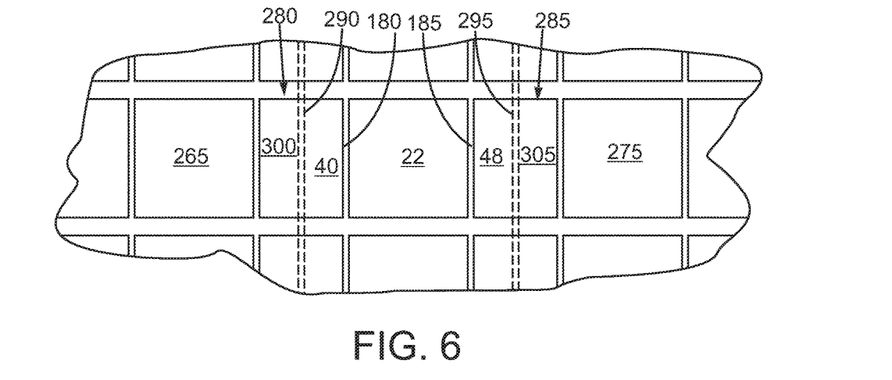
FIG. 6 is a plan view of the reconstituted wafer of FIG. 5.

An exemplary process for fabricating the semiconductor chip device 10 depicted in FIGS. 1 and 2 will now be described in conjunction with FIGS. 5, 6, 7, 8, 9, 10, 11, 12, 13, 14, 15 and 16 and initially with reference to FIG. 5, which is a sectional view that depicts the semiconductor chip 22, the dummy chip 40 and the dummy chip 48 mounted on a carrier wafer 260. The carrier wafer 260 is advantageously composed of silicon, another semiconductor material, various types of glasses or other carrier substrate materials. The dummy chip 40 is secured to the carrier wafer 260 by way of the insulating bond layer 100, which will be eventually carried over to the semiconductor chip 15 as described in more detail below. The semiconductor chip 22 is similarly connected to the carrier wafer 260 by way of the insulating bond layer 120, which will eventually be carried over to the semiconductor chip 15 and the dummy chip 48 is connected to the carrier wafer 260 by way of the insulating bond layer 160, which will be eventually carried over to the semiconductor chip 15. FIG. 5 is a somewhat simplified depiction of the arrangement with the carrier wafer 260 in that the dummy chips 40 and 160 and the semiconductor chip 22 are mounted on the carrier wafer 260 along with a potentially large number of other such accommodations of chips and dummy chips to all form a reconstituted wafer. At this stage, the dummy chips 40 and 48 and the semiconductor chip 22 have not undergone thinning or reveal of the through-chip-vias 215 of the semiconductor chip 22. Note that the dummy chip 40 and the dummy chip 160 are laterally separated from the semiconductor chip 22 to establish the aforementioned gaps 180 and 185. As additional dummy chips such as 42 and 50 and additional semiconductor chips 24, 26 (see FIGS. 1 and 2), etc. are stacked on the arrangement depicted in FIG. 5, the height of the gaps 180 and 185 will increase correspondingly. Attention is now turned briefly to FIG. 6, which is a plan view of the semiconductor chip 22 and a couple of adjacent semiconductor chips 265 and 270, which are simply additional copies of the semiconductor chip 22. Note that two dummy chips 280 and 285 are positioned on either side of the semiconductor chip 22. A dicing street 290 is represented by the dashed lines is positioned at about the mid-point of the dummy chip 280 and another dicing street 295 is positioned at about the mid-point of the dummy chip 285. When singulation occurs subsequently along the dicing streets 290 and 295, the semiconductor chip 280 will be divided into the dummy chip 40, which stays with the semiconductor chip 22 and another dummy chip 300, which will stay with the semiconductor chip 265. Upon singulation, the dummy chip 285 will be subdivided into the dummy chip 48, which stays with the chip 22 and another dummy chip 305, which will stay with the semiconductor chip 275. In this way, a single dummy chip, say the dummy chip 280, can be subdivided into multiple parts that can remain with the functional semiconductor chips 22, 265, etc.

Figure 7:
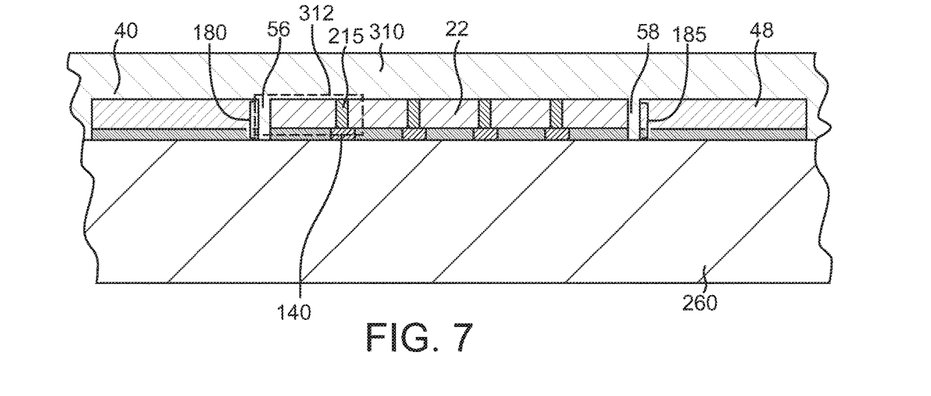
FIG. 7 is a sectional view like FIG. 5, but depicting exemplary insulating material deposition.
Figure 8:
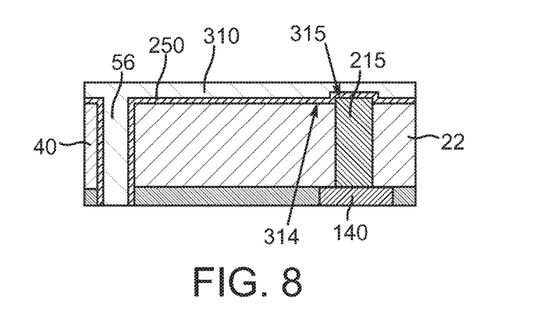
FIG. 8 is a portion of FIG. 7 shown at greater magnification.
Figure 9:
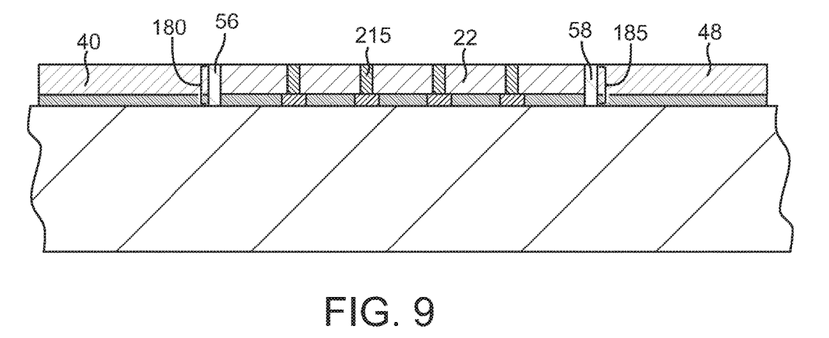
FIG. 9 is a sectional view like FIG. 8, but depicting exemplary insulating material thinning.

After the dummy chips 40 and 48 and the semiconductor chip 22 are mounted to the carrier wafer 260, the dummy chips 40 and 48 and the semiconductor chip 22 are thinned to reveal the through-chip-vias 215 as shown in FIG. 7 and an insulating layer 310 is deposited to fill the gaps 180 and 185. Note the location of the dashed rectangle 312, which encompasses portions of the interconnect 140, the semiconductor chip 22, one of the through-chip-vias 215 and portions of the insulating layer 56 and the insulating layer 310. Those portions are shown somewhat magnified in FIG. 8. Referring now to FIGS. 7 and 8, the reveal process is preferably a soft reveal wherein the semiconductor chip 22 is subjected to a grinding process to just above the tops of the through-chip vias 215, followed by an etch back to reveal the tops of the through-chip-vias 215. Note that the upper surface 314 of the semiconductor chip 22 is etched back to slightly below the top 315 of the through-chip-via 215. Of course, the dummy chips 40 and 48 are concurrently thinned in this grinding and etch back. Next, a double deposition process is used to establish a thin silicon oxynitride layer 250 (visible in FIG. 8 and FIGS. 3 and 4) and the thick insulating layer 310 composed of oxide (SiOx). The oxynitride layer 250 lines the gap 180 and coats the dummy chips 40 and 48 and the semiconductor chip 22 and the through-chip-via 215 thereof, and depending on device geometry, can be on the order of a fraction of a micron in thickness. The oxynitride layer 250 and the oxide insulating layer 310 are preferably deposited using plasma enhanced chemical vapor deposition to blanket coat the dummy chips 40 and 48 and the semiconductor chip 22 and fill the gaps 180 and 185 to establish the initial portions of the insulating layers 56 and 58. The insulating layer 310 is preferably composed of SiOx or even stoichiometric silicon dioxide and deposited using plasma enhanced chemical vapor deposition (PECVD), and depending on device geometry, can be on the order of less than 100 microns in thickness. However, another form of insulating material might be used for the insulating layer 310. Next, a chemical mechanical polishing (CMP) step is performed to thin the insulating layer 310 while leaving in place in the insulating layers 56 and 58 as shown in FIG. 9. The CMP process is selective to oxynitride so that the oxynitride layer 250 remains in place and attack of the underlying dummy chips 40 and 48 and the semiconductor chip is minimal, although the through-chip-vias 215 are revealed in preparation for metallurgical bonding with the conductors of the next chip to be stacked thereon. Again, the carrier wafer 260 facilitates these various grinding, etching, deposition and CMP processes.

Figure 10:
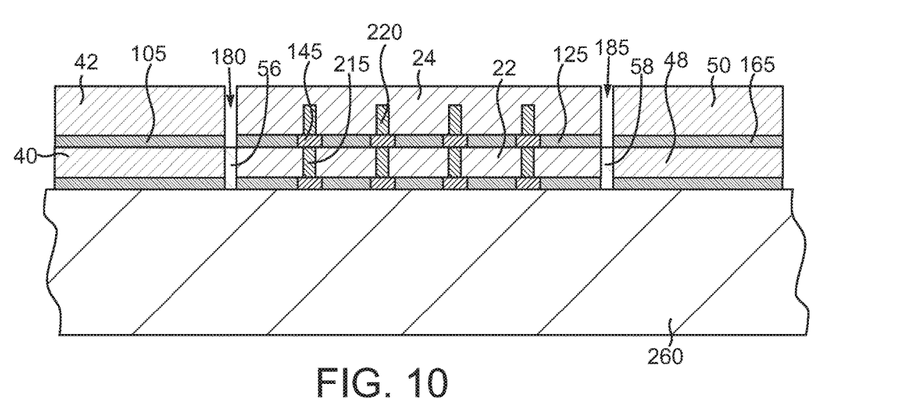
FIG. 10 is a sectional view like FIG. 9, but depicting exemplary chip and dummy component stacking on the wafer.

Next and as shown in FIG. 10, the dummy chips 42 and 50 are mounted on the dummy chips 40 and 48, respectively, and the semiconductor chip 24 is mounted on the semiconductor chip 22 and annealed at about 300° C. for about 30 to 60 minutes to form the requisite oxynitride-oxide bonds and metal-metal bonds. As noted above, the dummy chips 42 and 50 are joined to the dummy chips 40 and 48, respectively, by way of the aforementioned insulating bonding layers 105 and 165, and the semiconductor chip 24 is joined to the semiconductor chip 22 by the insulating bonding layer 125. The insulating bonding layers 105, 165 and 125 consist partly of the oxynitride layer 250 and partly of SiOx layers (element 245 shown in FIGS. 3 and 4) on the lower surfaces of the dummy chips 42 and 50 and the semiconductor chip 24. The oxynitride layer 250 visible in FIG. 8 is present but not visible in FIG. 10. Note also that, with regard to the interface between the chips 22 and 24, the interconnects 145 will be bonded to the through-chip-vias 215 as described above in conjunction with FIGS. 3 and 4. This stacking process increases the overall height of the gaps 180 and 185 above the insulating layers 56 and 58. At this point the dummy chips 42 and 50 and the chip 24 are not yet thinned and thus the through-chip-vias 220 of the semiconductor chip 24 are not yet revealed.

Figure 11:
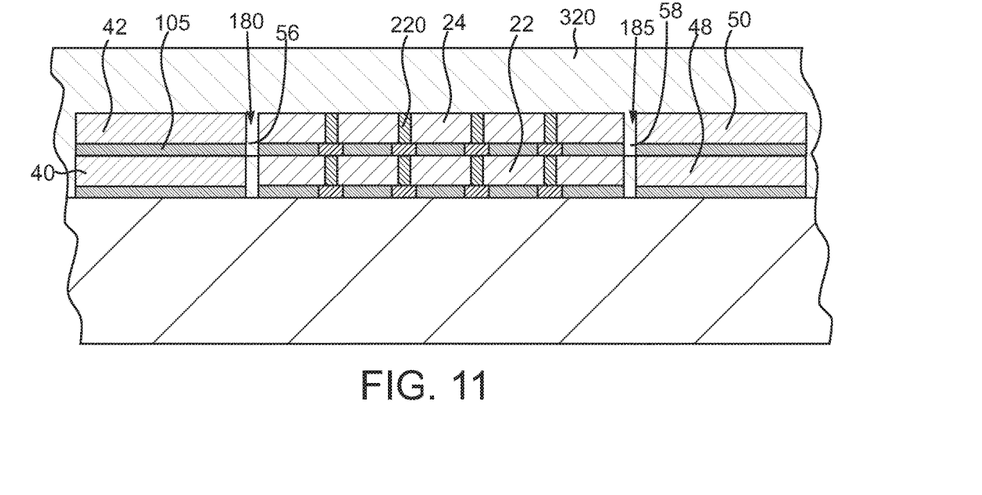
FIG. 11 is a sectional view like FIG. 10, but depicting exemplary insulating material deposition.
Figure 12:
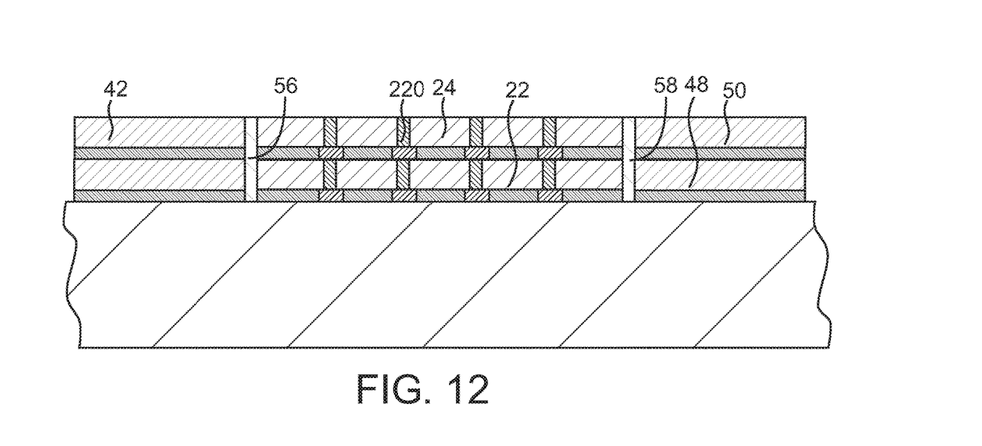
FIG. 12 is a sectional view like FIG. 11, but depicting exemplary insulating material thinning.

Next and as shown in FIG. 11, the same processes just described for the dummy chips 40 and 48 and the semiconductor chip 22 are repeated for the dummy chips 42 and 50 and the semiconductor chip 24, namely a soft reveal of the through-chip-vias 220 followed by a double deposition process with a thin silicon oxynitride layer 250 (visible in FIG. 8 and FIGS. 3 and 4) and the thick insulating layer 320 composed of oxide (SiOx). The process steps fill the portions of the gaps 180 and 185 between the chip 24 and the dummy chips 42 and 50 and thus increase the overall height of the insulating layers 56 and 58. Next and as shown in FIG. 12, a CMP process is performed to remove the excess portions of the insulating layer 320 and thin the dummy chips 42 and 50 and the chip 24 and produce a reveal of the through-chip-vias 220 and reduce the overall heights of the insulating layers 56 and 58. Again, the carrier wafer 260 facilitates these various grinding, etching, deposition and CMP processes.

Figure 13:
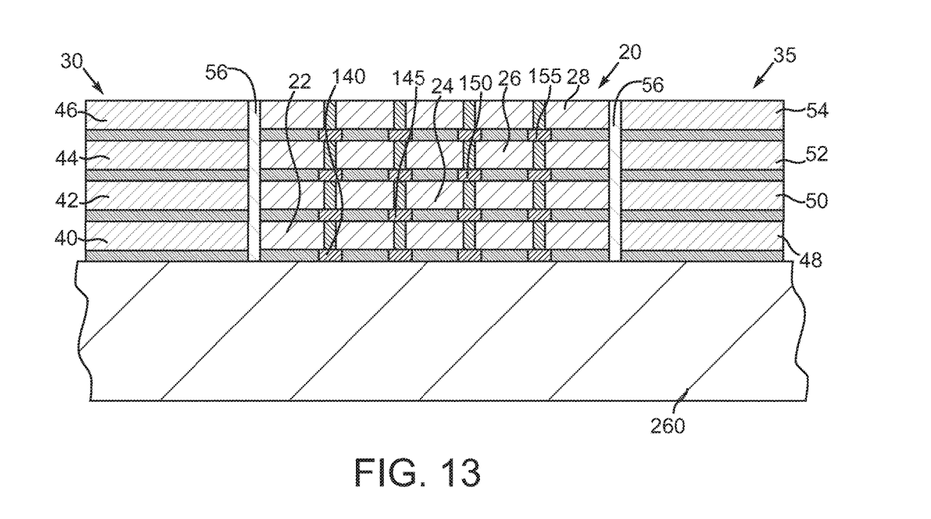
FIG. 13 is a sectional view like FIG. 12, but depicting additional chip and dummy chip stacking.

As shown in FIG. 13, the foregoing stacking, insulation material deposition, grinding, CMP and annealing processes are repeated again and again to produce the completed dummy components 30 and 35 consisting of the dummy chips 40, 42, 44 and 46, 48, 50, 52 and 54, respectively, the chip stack 20 consisting of the semiconductor chips 22, 24, 26 and 28 and interconnects 140, 145, 150 and 155 and the insulating layers 56 and 58 on the carrier wafer 260.

Figure 14:
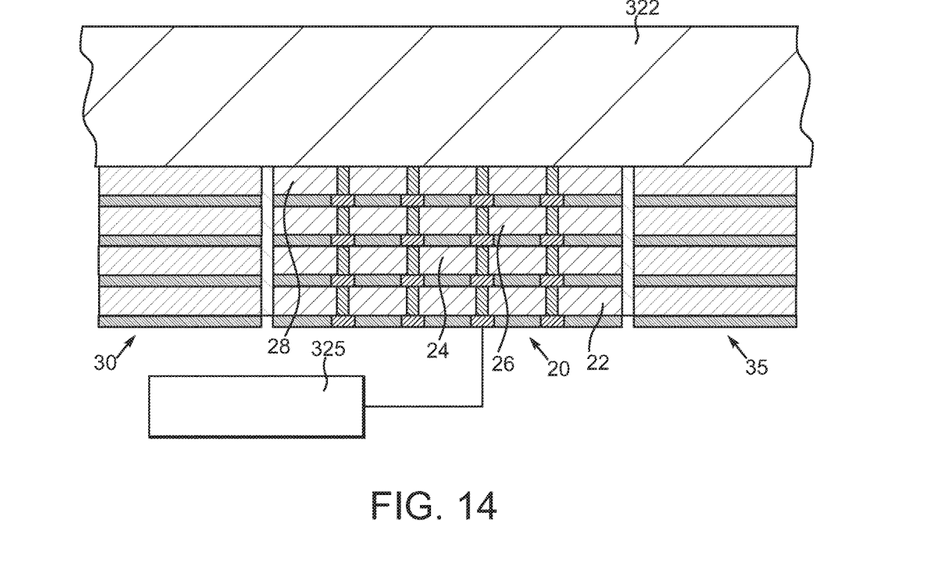
FIG. 14 is a sectional view like FIG. 13, but depicting exemplary electric testing of the stack.
Figure 15:
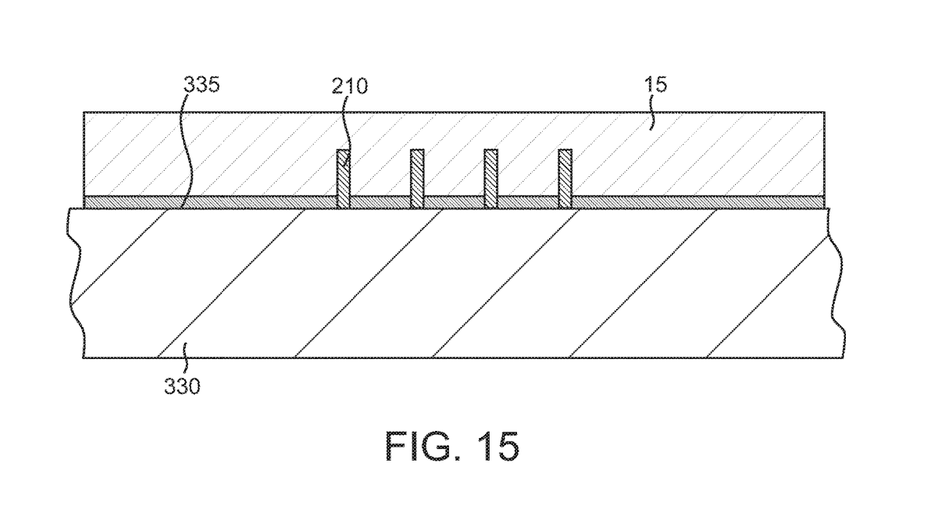
FIG. 15 is sectional view of an exemplary semiconductor wafer of semiconductor chips following initial processing.

With the dummy components 30 and 35 and the chip stack 20 completed, the carrier wafer 260 depicted in FIG. 12 is removed by grinding or other removal process and another carrier wafer 322 is mounted to the combination of the dummy components 30 and 35 and the chip stack 20, albeit on the opposite side of the position that was used for the carrier wafer 260 depicted in the earlier figures. Next, the chips 22, 24, 26 and 28 of the chip stack 20 are tested using a testing apparatus 325, which can be a probe or other type of testing device to establish whether or not the chip stack 20 consists of four known good die or not. If the combination of the dummy components 30 and 35 in the chip stack 20 successfully passes the testing, then upon singulation, the combination is ready to be mounted to one of the semiconductor chips, such as the chip 15 depicted in earlier figures.

Figure 16:
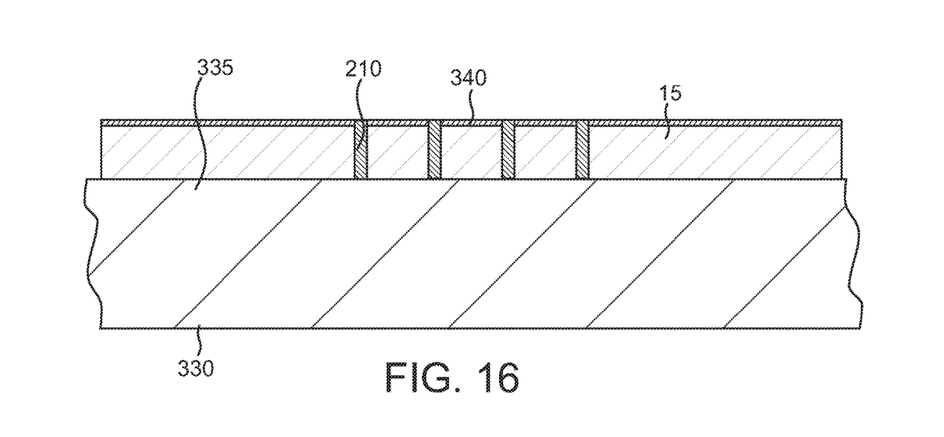
FIG. 16 is a sectional view like FIG. 15, but depicting wafer thinning and insulating material deposition.

The foregoing process describes the creation of the combination of the dummy components 30 and 35 and a chip stack 20. The process to create the semiconductor chip 15 upon which that combination is ultimately mounted will now be described in conjunction with FIGS. 15, 16 and 17. Attention is initially turned to FIG. 15, which is a sectional view of the semiconductor chip 15 mounted on a carrier wafer 330 by way of an insulating bonding layer 335, which can be like the insulating bonding layers 100, 105, etc. described elsewhere herein. The carrier wafer 330 is advantageously composed of silicon, another semiconductor material, various types of glasses or other carrier substrate materials. At this point, the semiconductor chip 15, which is preferably but not necessarily part of an overall wafer that facilitates wafer level processing has not been thinned and thus its through-chip-vias 210 have not been revealed at this point. Next and as shown in FIG. 16, a soft reveal process is preferably performed wherein the semiconductor chip 15 is subjected to a grinding process to just above the tops of the through-chip vias 210, followed by an etch back to reveal the tops of the through-chip-vias 210. Next, a deposition process is used to establish a thin silicon oxynitride layer 340 that will form part of the insulating bonding layer 100 depicted in FIG. 2. Like the other oxynitride layers 250 described elsewhere herein, the oxynitride layer 340 can be on the order of a fraction of a micron in thickness and deposited by PECVD. Again the carrier wafer 330 provides support during this thinning process.

Figure 17:
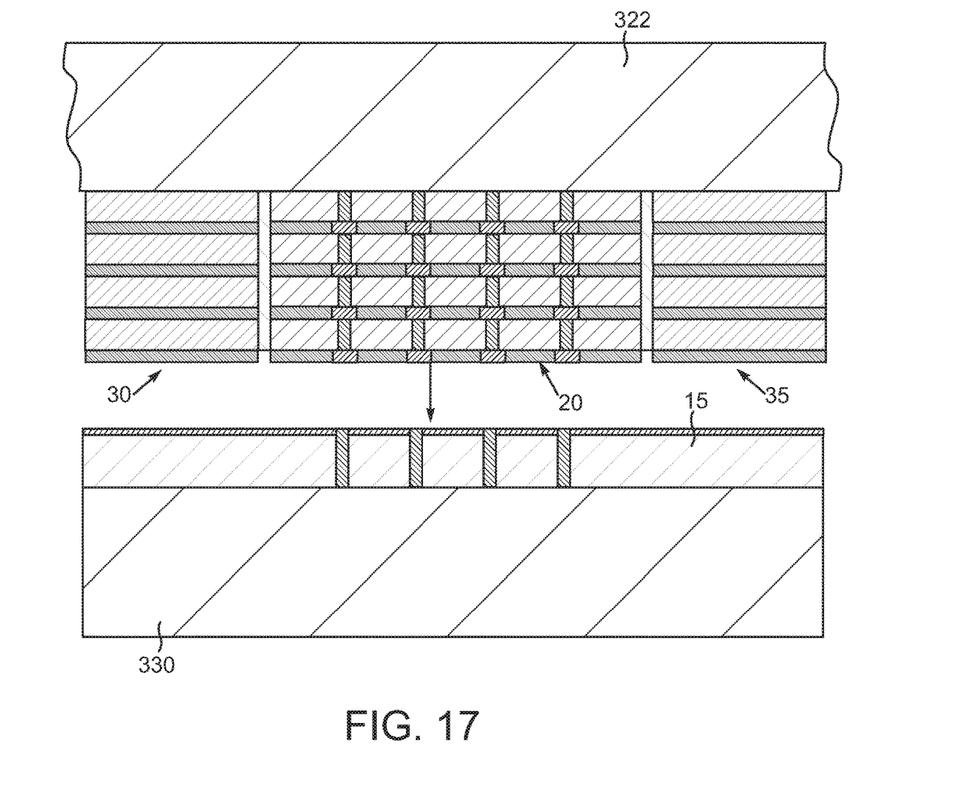
FIG. 17 is a sectional view like FIG. 16, but depicting exemplary chip stack stacking on a base semiconductor chip.

Next and as shown in FIG. 17, the combination of the dummy components 30 and 35 and the chip stack 20 is mounted on the semiconductor chip 15 and this mounting process can be performed after the semiconductor chip 15 and its underlying portion of the carrier wafer 330 are singulated from the overall larger carrier wafer 330. As noted above, there will be established the insulating bonding layer 120 and the interconnects 140 shown in FIG. 2.

Figure 18:
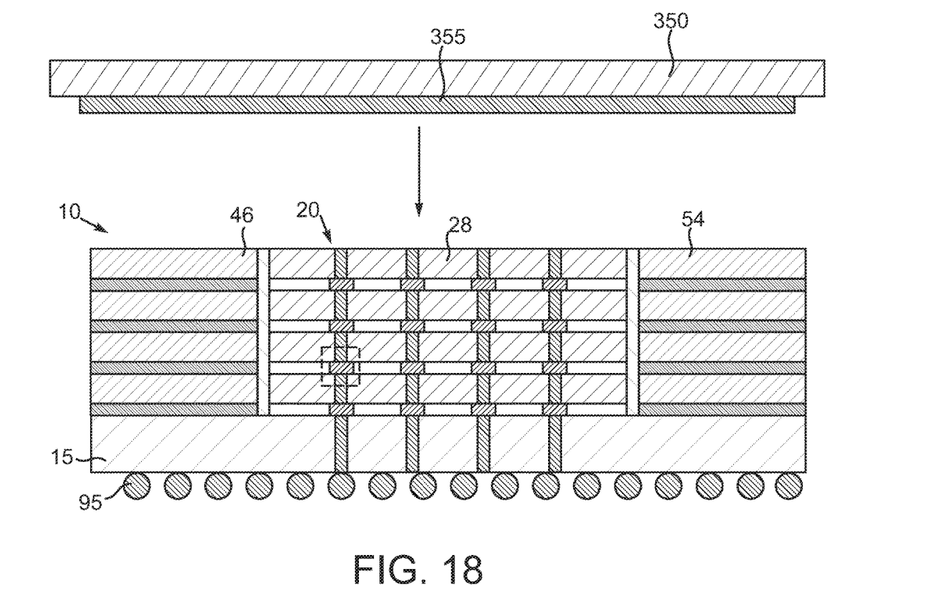
FIG. 18 is a sectional view like FIG. 2, but depicting exemplary heat spreader mounting.

Thereafter, the carrier wafers 322 and 330 can be removed by grinding or other removal processes to produce the essentially completed semiconductor chip device 10 depicted in FIG. 18. Note that prior to removal of the carrier wafer 322, but after this removal of the carrier wafer 330, the I/Os 95 are mounted on the semiconductor chip 15. It should be understood that following fabrication of the semiconductor chip device 10, a thermal management device such as the depicted heat spreader 350 can be mounted on the dummy chips 46 and 54 and the top chip 28 of the chip stack 20 to provide thermal management, a suitable thermal interface material 355 can be interposed between the dummy chips 46 and 54 and the chip 28 and the heat spreader 350. The heat spreader 350 can be composed of well-known heat transfer materials, such as copper, aluminum, stainless steel or the like. The thermal interface material 355 can be an adhesive, such as an epoxy, an organic TIM, such as silicone rubber mixed with aluminum particles and zinc oxide. Compliant base materials other than silicone rubber and thermally conductive particles other than aluminum may be used. Thermal greases and gold, platinum and silver represent a few examples. In other arrangements the thermal interface material 355 can be a nanofoil composed of layers of aluminum and nickel.

Figure 19:
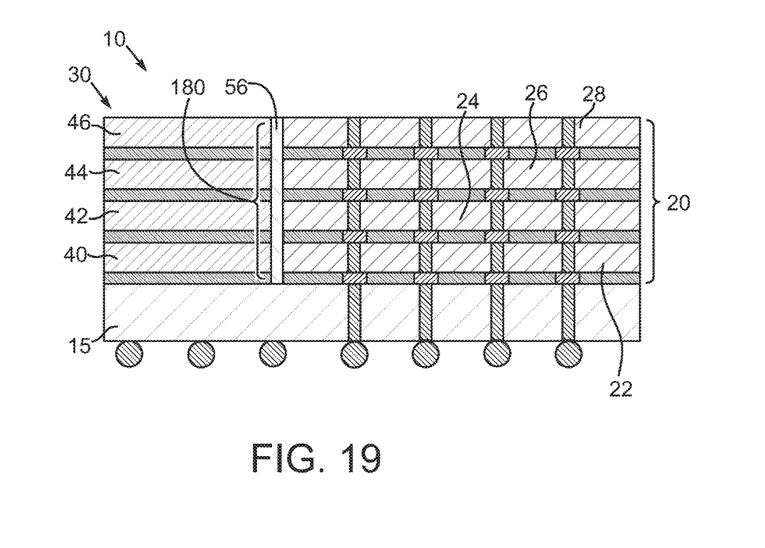
FIG. 19 is a sectional view like FIG. 2, but depicting an alternate exemplary semiconductor chip device that includes a semiconductor chip and a stack of semiconductor chips and one or more dummy components positioned thereon.

The techniques described herein can be expanded to include structures with other than two dummy components 30 and 35 depicted in FIGS. 1-3. For example, and as shown in FIG. 19, which is a sectional view like FIG. 2, the semiconductor chip device 10 can be configured with the chip stack 20 mounted on the semiconductor chip 15 and a single dummy component 30 positioned to one side of the chip stack 20. There is the insulating layer 56 positioned in the gap 180 between the dummy components, or more specifically the dummy chips 40, 42, 44 and 46, and the chips 22, 24, 26 and 28 of the chip stack 20. Indeed, one or more dummy components 30 could be used.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip device, comprising:
a first semiconductor chip;
a second semiconductor chip stacked on the first semiconductor chip;
a first insulating bonding layer positioned between the first semiconductor chip and the second semiconductor chip and bonding the first semiconductor chip to the second semiconductor chip, the first insulating bonding layer including a first inorganic insulating layer and a second inorganic insulating layer bonded to the first inorganic insulating layer;
plural interconnects between and electrically connecting the first semiconductor chip and the second semiconductor chip;
a first dummy component stacked on the first semiconductor chip and separated from the second semiconductor chip by a first gap;
a second insulating bonding layer positioned between the first dummy component and the first semiconductor chip and bonding the first dummy component to the first semiconductor chip, the second insulating bonding layer including a first inorganic insulating layer and a second inorganic insulating layer bonded to the first inorganic insulating layer; and
an inorganic insulating layer in the first gap.

2. The semiconductor chip device of claim 1, comprising a second dummy component stacked on the first semiconductor chip and separated from the second semiconductor chip by a second gap, another inorganic insulating layer in the second gap, and a third insulating bonding layer positioned between the second dummy component and the first semiconductor chip and bonding the second dummy component to the first semiconductor chip, the third insulating bonding layer including a first inorganic insulating layer and a second inorganic insulating layer bonded to the first inorganic insulating layer.

3. The semiconductor chip device of claim 1, comprising wherein the first inorganic insulating layer of the first insulating bonding layer, the second insulating bonding layer and the third insulating bonding layer comprises silicon oxynitride and the second inorganic insulating layer of the first insulating bonding layer, the second insulating bonding layer and the third insulating bonding layer comprises SiOx.

4. The semiconductor chip device of claim 1, wherein the inorganic insulating layer and the another inorganic insulating layer comprise a SiOx inner core lined with silicon oxynitride.

5. The semiconductor chip device of claim 1, wherein the interconnects comprise a copper pad metallurgically bonded to a through-chip-via.

6. The semiconductor chip device of claim 2, wherein the first dummy component comprises plural dummy chips stacked together and the second dummy component comprises plural dummy chips stacked together.

7. The semiconductor chip device of claim 2, wherein the first semiconductor chip having a floor plan with a high heat producing area and a low heat producing area, the second semiconductor chip being stacked on the low heat producing area and the first dummy component and the second dummy component being stacked on the high heat producing area.

8. The semiconductor chip device of claim 7, wherein the high heat producing area comprises at least one processor core.

9. The semiconductor chip device of claim 2, wherein the second semiconductor chip comprises a first edge and a second and opposite edge, the first dummy component having an outer edge substantially coterminous with the first edge and the second dummy component having an outer edge substantially coterminous with the second edge.

10. A semiconductor chip device, comprising:
a stack of plural semiconductor chips, each two adjacent semiconductor chips of the stack of plural semiconductor chips being electrically connected by plural interconnects and physically connected by a first insulating bonding layer, the first insulating bonding layer including a first insulating layer and a second insulating layer bonded to the first insulating layer;
a first stack of dummy chips positioned opposite a first side of the stack of semiconductor chips and separated from the plural semiconductor chips by a first gap, each two adjacent of the first stack of dummy chips being physically connected by a second insulating bonding layer, the second insulating bonding layer including a first insulating layer and a second insulating layer bonded to the first insulating layer;
a second stack of dummy chips positioned opposite a second side of the stack of semiconductor chips and separated from the stack of plural semiconductor chips by a second gap, each two adjacent of the second stack of dummy chips being physically connected by a third insulating bonding layer, the third insulating bonding layer including a first insulating layer and a second insulating layer bonded to the first insulating layer; and
an insulating layer in the first gap and another insulating layer in the second gap.

11. The semiconductor chip device of claim 10, comprising another semiconductor chip, the stack of semiconductor chips being positioned on the another semiconductor chip.

12. The semiconductor chip device of claim 11, wherein the another semiconductor chip having a floor plan with a high heat producing area and a low heat producing area, the stack of semiconductor chips being stacked on the low heat producing area and the first stack of dummy chips and the second stack of dummy chips being stacked on the high heat producing area.

13. The semiconductor chip device of claim 11, wherein the second semiconductor chip comprises a first edge and a second and opposite edge, the first dummy component having an outer edge substantially coterminous with the first edge and the second dummy component having an outer edge substantially coterminous with the second edge.

14. The semiconductor chip device of claim 10, comprising wherein the first insulating layer of the first insulating bonding layer, the second insulating bonding layer and the third insulating bonding layer comprises silicon oxynitride and the second insulating layer of the first insulating bonding layer, the second insulating bonding layer and the third insulating bonding layer comprises SiOx.

15. The semiconductor chip device of claim 10, wherein the insulating layer and the another insulating layer comprise a SiOx inner core lined with silicon oxynitride.

16. The semiconductor chip device of claim 10, wherein the interconnects comprise a copper pad metallurgically bonded to a through-chip-via.

17. A method of manufacturing, comprising:
stacking a second semiconductor chip on a first semiconductor chip;
forming a first insulating bonding layer between the first semiconductor chip and the second semiconductor chip bonding the first semiconductor chip to the second semiconductor chip, the first insulating bonding layer including a first inorganic insulating layer and a second inorganic insulating layer bonded to the first inorganic insulating layer;
forming plural interconnects between and electrically connecting the first semiconductor chip and the second semiconductor chip;
stacking a first dummy component on the first semiconductor chip and separated from the second semiconductor chip by a first gap;
forming a second insulating bonding layer between the first dummy component and the first semiconductor chip and bonding the first dummy component to the first semiconductor chip, the second insulating bonding layer including a first inorganic insulating layer and a second inorganic insulating layer bonded to the first inorganic insulating layer; and
forming an inorganic insulating layer in the first gap.

18. The method of claim 17, comprising stacking a second dummy component on the first semiconductor chip and separated from the second semiconductor chip by a second gap and, forming a third insulating bonding layer between the second dummy component and the first semiconductor chip and bonding the second dummy component to the first semiconductor chip, the third insulating bonding layer including a first inorganic insulating layer and a second inorganic insulating layer bonded to the first inorganic insulating layer, and forming another inorganic insulating layer in the second gap.

19. The method of claim 17, wherein the first inorganic insulating layer of the first insulating bonding layer, the second insulating bonding layer and the third insulating bonding layer comprises silicon oxynitride and the second inorganic insulating layer of the of the first insulating bonding layer, the second insulating bonding layer and the third insulating bonding layer comprises SiOx.

20. The method of claim 17, wherein the inorganic insulating layer and the another inorganic insulating layer comprise a SiOx inner core lined with silicon oxynitride.

21. The method of claim 18, wherein the first dummy component comprises plural dummy chips stacked together and the second dummy component comprises plural dummy chips stacked together.

22. The method of claim 18, wherein the second semiconductor chip comprises a first edge and a second and opposite edge, the first dummy component having an outer edge substantially coterminous with the first edge and the second dummy component having an outer edge substantially coterminous with the second edge.

* * * * *